United States Patent [19]

Stevens et al.

[11] Patent Number: 5,585,298
[45] Date of Patent: Dec. 17, 1996

[54] SELF ALIGNED ANTIBLOOMING STRUCTURE FOR SOLID STATE IMAGE SENSORS

[75] Inventors: Eric G. Stevens; Stephen L. Kosman, both of Rochester, N.Y.

[73] Assignee: Eastman Kodak Company, Rochester, N.Y.

[21] Appl. No.: 415,113

[22] Filed: Mar. 31, 1995

[51] Int. Cl.[6] .......................... H01L 21/70; H01L 27/00; H01L 27/148; H01L 29/768
[52] U.S. Cl. .................. 437/53; 437/931; 257/223; 257/230
[58] Field of Search ................... 437/53, 50, 931; 257/223, 224, 230, 231, 229, 232, 233

[56] References Cited

U.S. PATENT DOCUMENTS

| | | | |
|---|---|---|---|
| 4,173,064 | 11/1979 | Farnow | 29/578 |
| 4,362,575 | 12/1982 | Wallace | 148/1.5 |
| 4,593,303 | 6/1986 | Dyck et al. | 357/24 |
| 4,603,342 | 7/1986 | Savoye et al. | 257/223 |
| 4,710,234 | 12/1987 | Blanchard | 437/40 |
| 5,002,896 | 3/1991 | Naruke | 437/50 |
| 5,115,458 | 5/1992 | Burkey et al. | 377/58 |
| 5,118,631 | 6/1992 | Dyck et al. | 457/29 |
| 5,130,774 | 7/1992 | Stevens et al. | 357/24 |
| 5,151,380 | 9/1992 | Hynecek | 437/53 |
| 5,349,215 | 9/1994 | Anagnostopoulos | 257/223 |

Primary Examiner—John Niebling
Assistant Examiner—Brian K. Dutton
Attorney, Agent, or Firm—James D. Leimbach

[57] ABSTRACT

A self aligned, lateral-overflow drain antiblooming structure that is insensitive to drain bias voltages and therefore has improved insensitivity to process variations. The length of the antiblooming barrier regions are easily adjusted and determined by photolithography. The self aligned, lateral-overflow drain (LOD) antiblooming structure results in a design that saves space, and hence, improves overall sensor performance. In this structure, an antiblooming potential barrier is provided that is smaller (in volts) than the barriers that separate the pixels from one another so that excess charge will flow preferentially into the LOD as opposed to the adjacent pixels.

22 Claims, 4 Drawing Sheets

SELF ALIGNED ANTIBLOOMING STRUCTURE FOR SOLID STATE IMAGE SENSORS

BACKGROUND OF THE INVENTION

1. Field of Invention

The present invention relates to antiblooming structures used within solid state image sensors, and more particularly, to self aligned antiblooming structures.

2. Background of the Invention

Blooming is a well known phenomenon that occurs in solid-state image sensors when the number of photocarriers generated by the incident radiation exceeds that of the storage capacity of the element, or pixel. These excess carriers then spill over, or "bloom", into adjacent photosites thereby degrading the integrity of the image. Many types of structures have been proposed in the past (such as U.S. Pat. No. 5,130,774) which discloses a device that provide sinks for these excess carriers, either laterally or vertically, adjacent the photodetector elements.

It is important to maintain high quantum efficiency and charge capacity. Therefore, it is important that antiblooming structures do not take up so much space that there is a resulting degradation in the quantum efficiency and charge capacity of the device. Many conventional antiblooming structures are inherently subject to level-to-level misalignment. The extra space taken up within these antiblooming structures to compensate for the level-to-level misalignment can result in a reduction in performance of the sensor.

Some of the more recent disclosures are contained in U.S. Pat. Nos. 5,349,215 issued to Anagnostopoulos et al. (hereinafter referred to as Anagnostopoulos); 5,130,774 issued to Stevens et al. (hereinafter referred to as Stevens); 5,118,631 issued to Dyck et al. (hereinafter referred to as Dyck); and 4,593,303 also issued to Dyck et al. (hereinafter referred to s Dyck "303"), describe relatively modern approaches at antiblooming structure design. Another important factor in the performance of these antiblooming structures is the length (in microns) of the blooming channel's barrier region. The length of the blooming channel's barrier regions in Anagnostopoulos and Stevens are unaffected by alignment, but they are not self aligned to the drain. The extra amount of area that must be added to compensate for misalignment becomes an important factor for small pixel size devices. Dyck discloses a self aligned structure, but offers little flexibility in adjusting the length of these barrier regions since this length depends on lateral diffusion of the barrier-region implant.

The length of the barrier regions in this structure is typically only about 0.5 µm. Although this is very short, thus conserving the pixel's surface area, it makes the structure susceptible to the so-called DIBL (drain-induced, barrier lowering) effect. This effect can reduce the antiblooming barrier height dramatically thereby resulting in reduced charge capacity and hence, lower dynamic range. This also makes the barrier height sensitive to the LOD voltage. Hence, this voltage may need to be adjusted on a part-to-part basis due to process variations. Also, changing the length of this region requires changing the process (by varying Dt).

As can be seen by the foregoing discussion, there remains a need within the art for an antiblooming structure design that can offer the advantages of self alignment and that solves the problems associated with short antiblooming barrier lengths.

SUMMARY OF THE INVENTION

The present invention disclosure describes a self aligned, lateral-overflow drain (LOD) antiblooming structure. The self aligned aspect of the design saves space, and hence, improves overall sensor performance. In this structure, a potential barrier is provided that is smaller (in volts) than the barriers that separate the pixels from one another so that excess charge will flow preferentially into the LOD as opposed to the adjacent pixels.

The present invention details a method of manufacturing an antiblooming structure for image sensors having a semiconductor substrate of a first conductivity type with a series of masking layers contained on a major surface of the substrate. It is necessary to define an antiblooming barrier region and a drain area adjacent the antiblooming barrier region on the major surface of the substrate and to remove the masking layers from the antiblooming barrier region and the drain area, using conventional etching techniques, to create at least a pair of spaced walls within the masking layers while leaving certain masking layers not being etched from the major surface within the spaced walls. A barrier region of the first conductivity type, like the substrate, is implanted through unremoved portions of the masking layers and within the spaced walls such that the barrier region is self aligned with the spaced walls. Locally Oxidized Silicon (LOCOS) regions are formed on the unremoved portions of the masking layers and within the spaced walls such that the LOCOS regions are self aligned with the barrier regions on the major surface. A second masking is performed to create a reverse image of the previous masking by removing any remaining masking layers that were used to define the LOCOS regions and covering the major surface of the substrate with a photoresist material prior to patterning the photoresist leaving a portion of the LOCOS regions and the previously defined drain region uncovered. Then anisotropically etching the remaining masking material within the drain region and a second conductivity type, that is opposite in conductivity from the first conductivity type, is implanted into the area defined by the photoresist and the drain region.

In the first embodiment of this invention, p-type antiblooming barrier regions are implanted through openings in a masking layer that are defined by photolithography. Then, an image reversal technique is used to form an opening that is self aligned to the inner edges of the first openings in a second masking layer through which the n-type LOD region is implanted. An optional p-type "container" implant may be provided for at this point.

In the second embodiment of the invention, the n-type LOD regions are implanted first through same opening in the second masking layer as formed above. Then, the first masking layer is etched off and the etch continues down through the second masking layer after which the p-type antiblooming barrier regions are implanted. In this embodiment, this barrier implant can be formed underneath the n-type LOD region thereby forming a "containing" implant to reduce the depletion depth underneath the LOD.

It is an object of this invention to provide an LOD antiblooming structure that is self aligned.

It is also an object of the present invention to provide an antiblooming structure having a barrier region with a channel length that is defined photolithographically and, therefore, easily adjusted without modification of the process.

It is still further an object of the present invention to provide an antiblooming structure wherein the antiblooming barrier height is fixed by processing and virtually insensitive to the bias voltage on the LOD.

It is still further an object of the invention to describe a method and apparatus for the manufacturing an antiblooming structure for image sensors characterized by: providing a semiconductor substrate of a first conductivity type, having a series of layers used for masking purposes contained on a major surface of the substrate; defining a first pattern upon the major surface; etching away a first preselected set of the series of layers defined by the first pattern to form at least a pair of spaced walls; implanting antiblooming barrier regions of the first conductivity type in at least one area defined by the spaced walls; forming a mask within and defined by the spaced walls; defining a second pattern that employs the mask to form at least a portion of the second pattern, to create the second pattern that is essentially self aligned with at least one wall of the pair of spaced walls; etching away a second predetermined set of the series of layers according to the pattern defined by the second pattern to create an area that is self aligned with the spaced walls; and implanting within the substrate between the spaced walls a second conductivity type that is opposite the first conductivity type such that it is adjacent and self aligned to the barrier region(s) to form a drain region of the antiblooming structure.

It is further the object of the invention to provide a method of constructing an antiblooming structure whereby the steps relating to the implanting of the drain and the antiblooming barrier regions can be essentially reversed.

The above and other objects of the present invention will become more apparent when taken in conjunction with the following description and drawings wherein like characters indicate like parts and which drawings form a part of the present invention.

The present invention has advantages over the prior art in that it provides a self aligned antiblooming channel regions that can be created using conventional etching techniques. The self aligned channels, also, provide for superior antiblooming protection because of their potential for greater antiblooming channel width. Additionally, the present invention offers higher quantum and charge capacity.

DETAILED DESCRIPTION OF THE INVENTION

It has been discovered that a self aligned, lateral-overflow drain antiblooming structure is insensitive to drain bias voltages and, therefore, has improved insensitivity to process variations. The length of the antiblooming barrier regions within such a structure can be easily adjusted and determined by photolithography.

FIGS. 1 through 5 show a process by which the first embodiment of the invention is manufactured. In the first embodiment of this invention, p-type antiblooming barrier regions are implanted through openings in a masking layer that are defined by photolithography. Then, an image reversal technique is used to form an opening that is self aligned to the inner edges of the first openings in a second masking layer through which the n-type LOD region is implanted. Also, an optional p-type "container" implant may be provided for at this point.

Although these figures show a n-type buried channel CCD, a p-type buried channel CCD could just as easily be formed by reversing the conductivity type of the appropriate layers as would be apparent to one skilled in the art. Additionally, different options for the substrate used include substrate layers with epitaxial layers, substrate layers without epitaxial layers, substrate with wells and substrates without wells.

Figure 1:
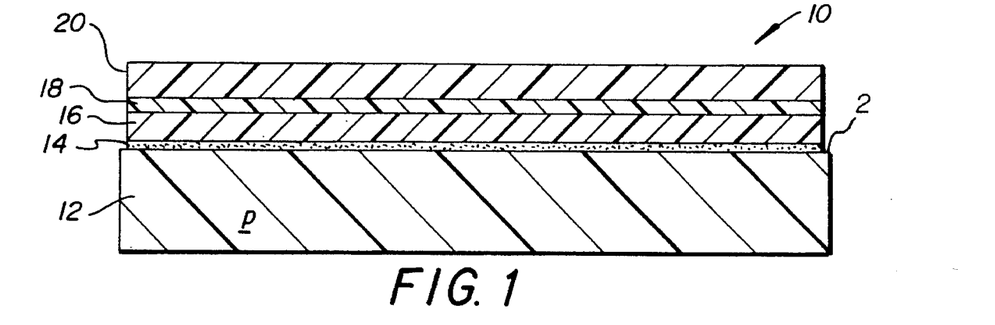
FIG. 1 is a cross section through a CCD channel showing the initial layer stack used in the manufacturing process of antiblooming structure for the present invention.

Referring now to FIG. 1, which is a cross section as seen through the layers used to construct the CCD channel and antiblooming structure in the manufacturing process, p-type silicon substrate 12 has placed on a major surface 2 a dielectric layer 14 that is preferably made from an oxide-nitride-oxide stack ($SiO_2$-$Si_3N_4$-$SiO_2$, commonly known as ONO). As would be apparent to those skilled in the art, depending on the etch chemistry employed, other materials may be employed for layer 14. A deposited silicon layer 16 (preferably polysilicon or amorphous) is placed on top of the dielectric layer and a masking layer 18 of $Si_3N_4$ is then placed on the deposited silicon layer 16. The series of layers is completed by a photoresist layer 20.

Figure 2:
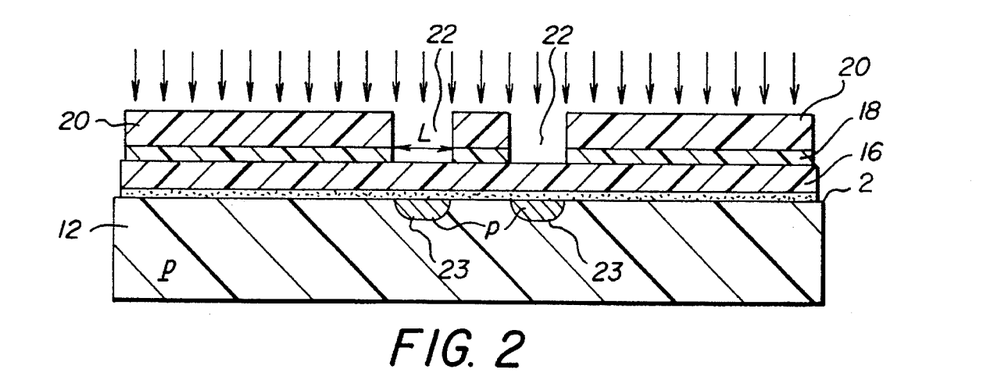
FIG. 2 illustrates the process steps for defining the antiblooming barrier region opening within the masking layers of FIG. 1 and implanting barrier regions.
Figure 3:
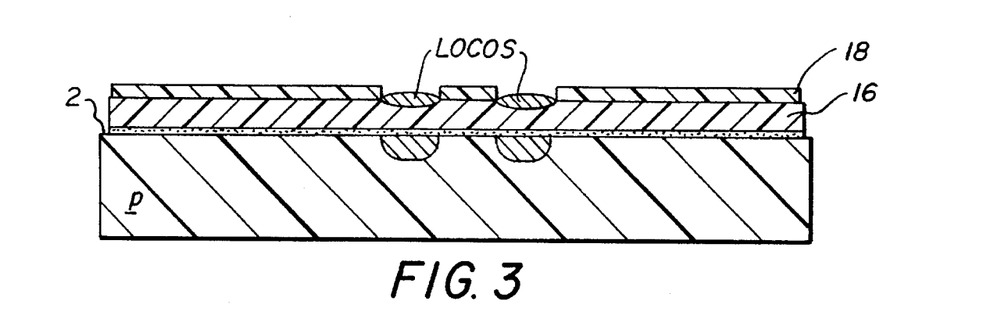
FIG. 3 illustrates the removal of the photoresist prior the local oxidation of the deposited silicon (LOCOS) creating edges of these regions that are self aligned to the barrier region's edges.

FIG. 2 illustrates the steps within the manufacturing process used to define the antiblooming barrier region openings 22 in the first masking layer 18 of $Si_3N_4$. Using conventional photolithography and etching techniques, the barrier region openings 22 are formed within the photoresist layer 20 and masking layer 18 etching away a first preselected set of the series of layers defined by the first masking layer 18 to form at least a pair of spaced walls. Boron ions (or other p-type species) of sufficient energy are then implanted through deposited silicon layer 16, as indicated by the arrows, to form antiblooming barrier regions 23 within the substrate 12 as defined by openings 22. Thereby, implanting antiblooming barrier regions of the same conductivity type as the substrate in at least the area defined by the spaced walls defining barrier region openings 22.

It is envisioned by the present invention that by etching away a second predetermined set of the series of layers according to the pattern defined by the second pattern to create an area that is self aligned with the spaced walls. Referrings to FIG. 3, the photoresist layer 20 is removed and the depositied silicon layer 16 is locally oxidized to form LOGOS 25 within the barrier region openings 22 using conventional techniques that are well known within the art, thereby forming a mask within and defined by the space walls. The edges of these LOCOS 25 regions are therefore self aligned to the edges of the barrier region openings 22. It will be apparent to those skilled in the art that only one LOCOS region 25 can be created within only one barrier region opening 22, the preferred embodiment, however, envisions that two LOCOS region 25 be created within two barrier region openings 22.

Figure 4:
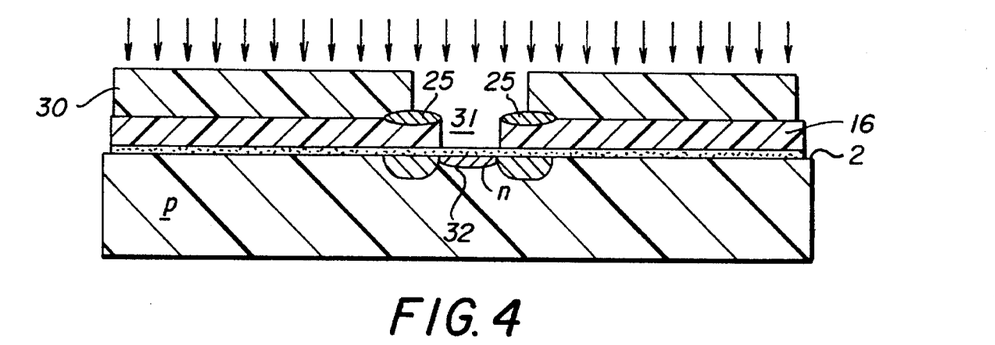
FIG. 4 illustrates masking and silicon nitride removal such that only a portion of the deposited silicon layer situated between the two barrier regions is exposed and anisotropically etched down to the dielectric stack, thereby forming a self aligned opening between the barrier regions through which a self aligned n-type LOD is then implanted.

Referring now to FIG. 4, by implanting within the substrate, and between the spaced walls, a conductivity type that is opposite that used in forming the substrate, such that it is adjacent and self aligned to the barrier regions(s) to form a drain region for the antiblooming structure, the $Si_3N_4$ layer 18 has been removed and another photoresist layer 30 is patterned such that it leaves a portion of the LOCOS regions 25 uncovered and the region situation between the two barrier regions is exposed. Thereby, defining a second pattern that employs LOCOS regions 25 as a mask to form at least a portion of the second pattern, and moreover, to create the second pattern such that is self aligned with at least one wall of the pair of spaced walls. This exposed region of deposited silicon is anisotropically etched down to the dielectric layer 14, thereby, forming an implant opening 31 between the barrier regions that are self aligned to their inner edges. An n-type lateral overflow drain (LOD) 32 is then implanted at sufficiently low energy so that it is self aligned to implant opening 31. Also, an optional p-type "container" implant (not shown) can be provided at this time to reduce the depletion depth under the LOD 32 if desired.

Figure 5:
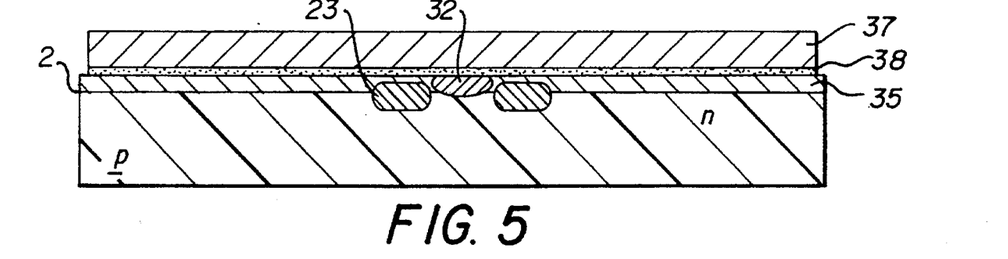
FIG. 5 illustrates the buried channel, gate electrode, and antiblooming structure of the completed CCD image sensor once the remaining layers are stripped from the device of FIG. 4 and the device is completed in a conventional manner.

FIG. 5 shows the device after remaining layers have been stripped off and the device is completed in the usual manner. Here, the photoresist layer 30, the masking layer 18, the deposited silicon layer 16 and the LOCOS regions 25 have all been removed. Preferably the dielectric layer 14 is removed and replaced with a fresh layer of gate dielectric material. Gate electrode 37 is placed on insulating layer 38. As shown in FIG. 5, an n-type buried channel 35 is used in the completed device.

A second embodiment of the invention is envisioned, whereby, the n-type LOD regions are implanted first through the same opening in the second masking layer as formed above in the first embodiment. Then, the first masking layer is etched off and an anisotropic etch continues down through the second masking layer after which the p-type antiblooming barrier regions are implanted. In this embodiment, this barrier implant can be formed underneath the n-type LOD region thereby forming a "containing" implant to reduce the depletion depth underneath the LOD.

Figure 6:
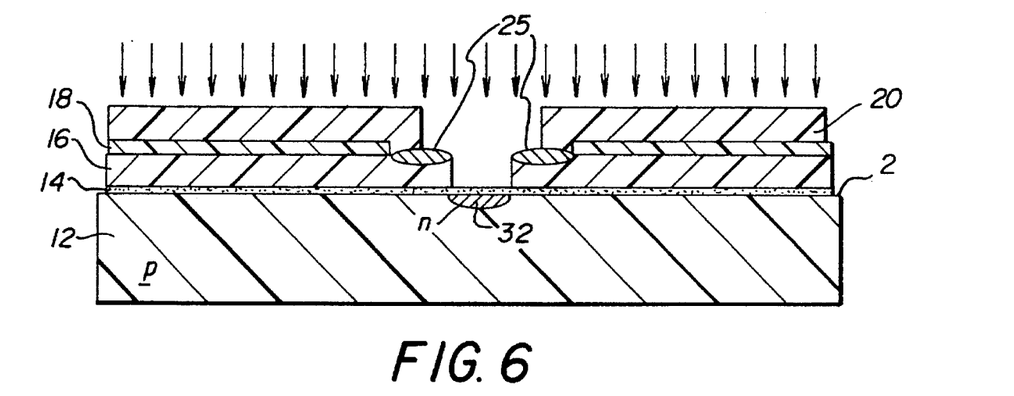
FIG. 6 shows a cross section of the second embodiment of the present invention at a stage of processing similar to that as shown in FIG. 4 but without the p-type barrier implants of the first embodiment.
Figure 7:
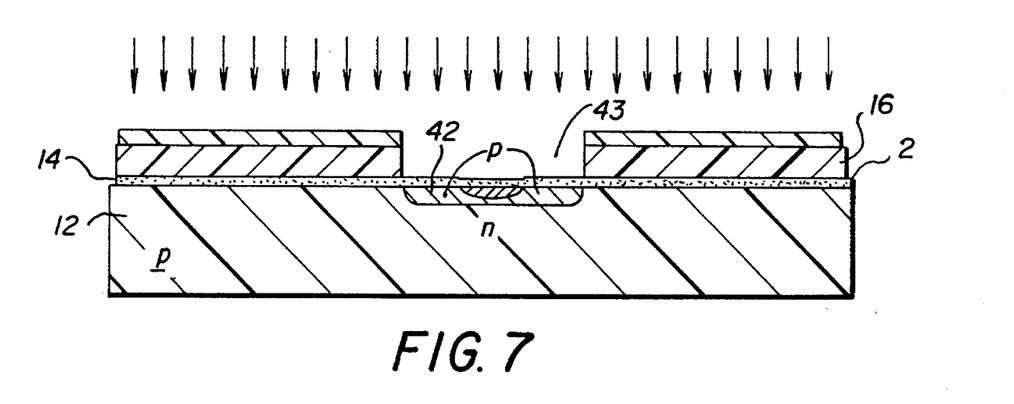
FIG. 7 is an illustration of the device of the second embodiment at a point in the process where the photoresist and LOCOS regions have been removed, the deposited silicon is anisotropically etched down to the dielectric stack forming an opening in the deposited silicon and the antiblooming barrier regions are implanted self aligned through this opening in the polysilicon masking layer.
Figure 8:
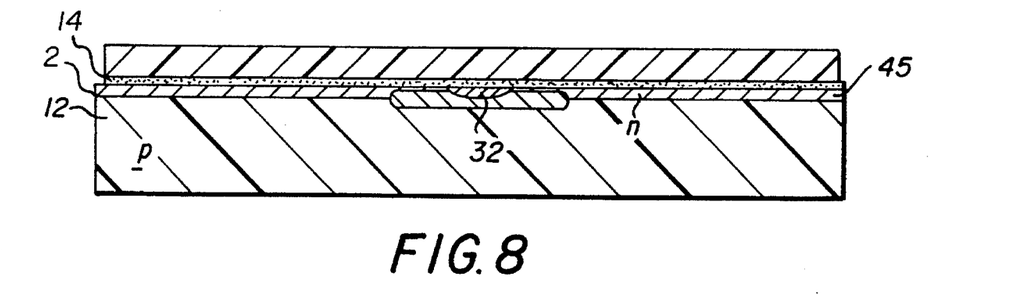
FIG. 8 illustrates the completed device of the second embodiment after the remaining layers have been stripped off and the device has been completed in the usual manner. This figure shows the buried channel, gate electrode, and antiblooming structure of the CCD image sensor.

FIGS. 6 through 8 illustrate the steps required to construct the second embodiment of this invention. Again, an n-channel CCD is shown.

FIG. 6 shows a cross section of the device at the stage of processing as shown in FIG. 4 of the first embodiment. Note that the p-type barrier implants 23 as shown in FIG. 5 have not been completed at this stage of the process as shown in FIG. 6. Also note that the nitride layer 18 has not been removed as was done in FIG. 4. The LOCOS regions 25 and n-type LOD 32 are formed in a manner similar to that shown for the first embodiment above.

As seen in FIG. 7, the photoresist layer 20 and LOCOS regions 25 are removed from the structure as shown in FIG. 6 and the polysilicon layer 16 is anisotropically etched down to layer 14. Next, the p-type antiblooming barrier regions 42 are implanted through this opening 43 in the deposited silicon masking layer 16.

FIG. 8 shows the completed device of the second embodiment. The remaining layers are stripped off and the device is completed in the usual manner with an n-type buried channel 45.

FIGS. 9 through 12 show an alternate scheme wherein the deposited silicon layer (polysilicon or other) is not used and the LOCOS regions 52 are grown on the single crystalline substrate 12.

Figure 9:
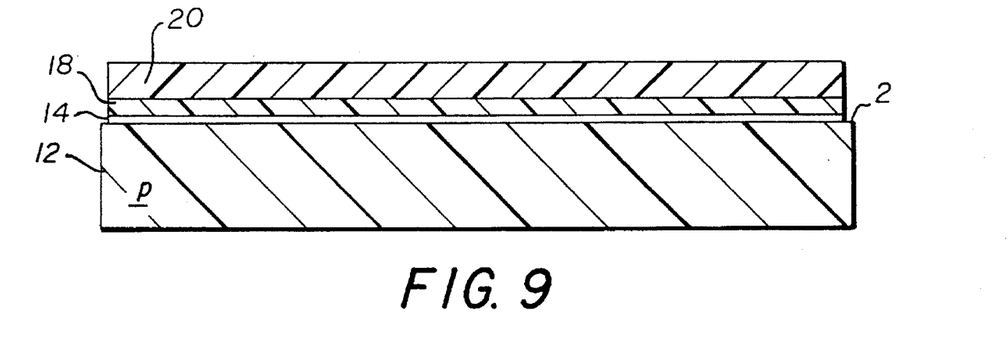
FIG. 9 is an illustration of the single crystalline silicon substrate and various layers used for another embodiment of the present invention without the deposited silicon layers of the previous embodiments.

FIG. 9 is an illustration of the single crystalline silicon substrate and various layers used for still another embodiment of the present invention without the deposited silicon layers of the previous embodiments. This is apparent from the various layers to construct the device.

Figure 10:
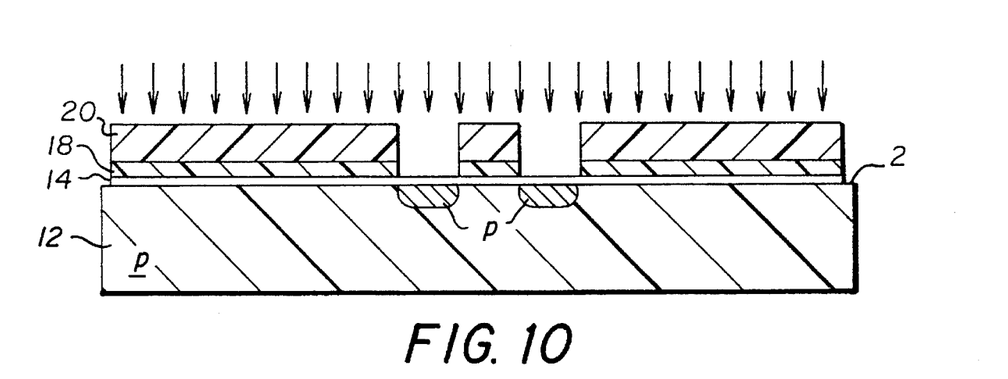
FIG. 10 is an illustration of placing p-type barrier implants into the configuration of FIG. 9.

FIG. 10 is an illustration of implanting p-type antiblooming barrier regions into the substrate of the configuration shown in FIG. 9. Conventional etching techniques are employed to form a pair of spaced walls within which these p-type barrier implants are formed.

Figure 11:
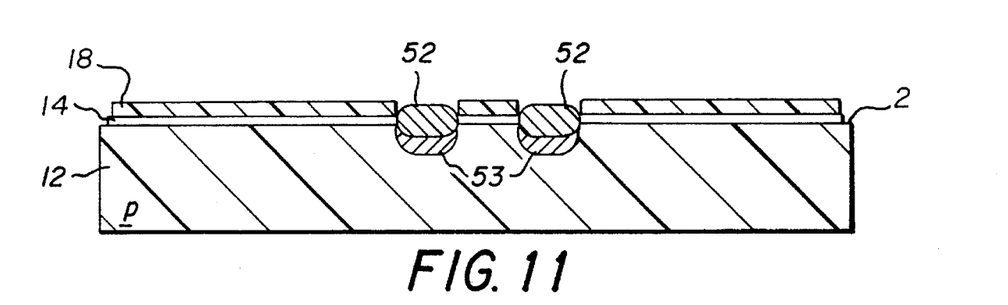
FIG. 11 is a diagram showing the growing of LOCOS regions self aligned to the barrier regions of FIG. 10 on the single crystalline substrate.

FIG. 11 is a diagram showing the growth of LOCOS regions on a single crystalline substrate within the spaced walls that are self aligned to the antiblooming barrier regions of FIG. 10.

Figure 12:
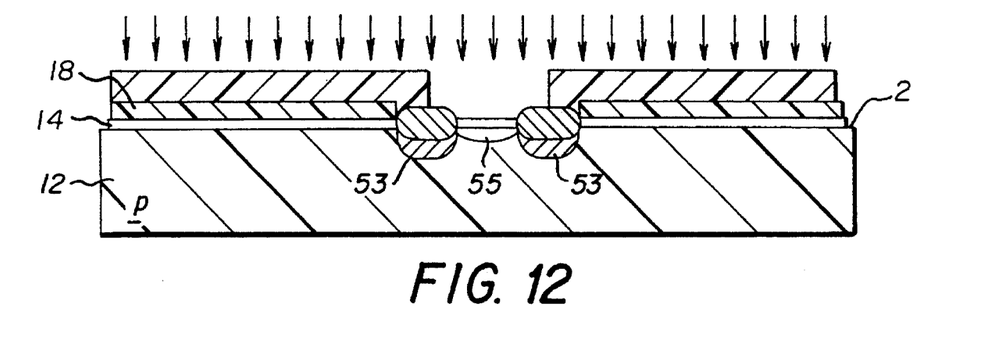
FIG. 12 shows the alternate scheme at the point in the process where the n-type LOD is implanted self aligned to the inner edges of the LOCOS regions of FIG. 11.

FIG. 12 shows the alternate scheme at the point in the process where the n-type LOD is implanted at sufficiently low energies such that it is self aligned to the inner edges of the LOCOS regions of FIG. 11. The n-type LOD implant 55 is therefore, masked by these thick, LOCOS regions 52 that are self aligned to the edges of the antiblooming barrier regions 53. Note that the procedure of implanting the antiblooming barrier regions after the LOD regions 55 as shown in FIGS. 6 through could also be employed here.

Figure 13A:
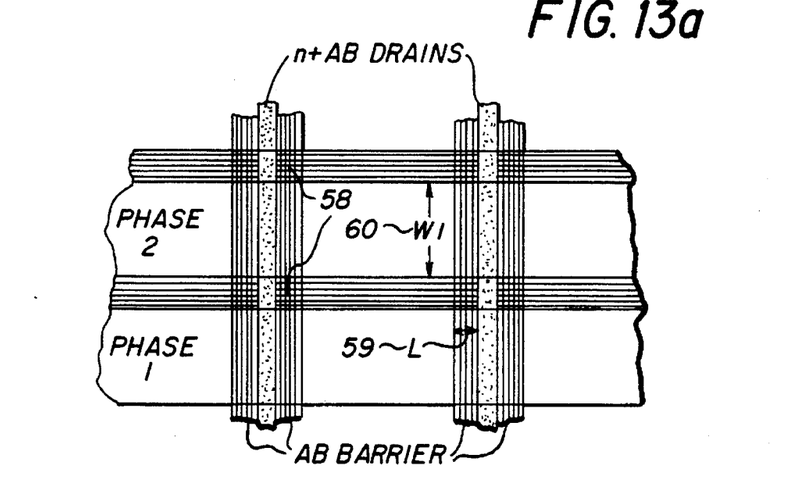
FIG. 13a is a top view of the implanted-barrier, true-two-phase CCD device with the antiblooming structure of the present invention containing blooming channels in both phases.

FIG. 13a is a top view of the implanted-barrier, true-two-phase CCD device with the antiblooming structure of the present invention. Antiblooming channels appear in each phase as with U.S. Pat. No. 5,130,774. The antiblooming drains have the antiblooming regions on either side consistent with the previous discussing of the present invention.

Still referring to FIG. 13a, there are additional advantages of the present invention which will be described further below. The amount of antiblooming protection (XAB) can be shown to be given by the relationships below.

$$X_{AB}=1+2\alpha[1+(W_{AB}L_{CCD}/L_{AB}W_{CCD})e^{\delta V/nV_t}] \quad \text{Equation 1}$$

Where:

α is charge in adjacent, unilluminated pixel as a fraction of charge in the illuminated pixel at the onset of blooming. (Typically defined to be 0.5);

$W_{AB}$, $L_{AB}$ is the width and length of the antiblooming barrier region, respectively;

$W_{CC}$, $L_{CCD}$ are the width and length of the CCD's barrier regions, respectively;

δV is the potential barrier height difference between the antiblooming barrier region and the CCD barrier region;

n is the nonideality factor (typically about 1.0 for LOD);

$V_t$ is the thermal voltage, kT/q, equal to approximately 26 mV at room temp.

k is Boltzman's constant.

T is absolute temperature in degrees kelvin.

q is the charge of an electron.

Therefore for δV greater than 50 to 75 mV, which represents two to three times kT/q at room temperature, and with α=0.5, $$X_{AB}=(W_{AB}L_{CD}/L_{AB}W_{CCD})e^{\delta V/nV_t} \quad \text{Equation 2}$$

Figure 13B:
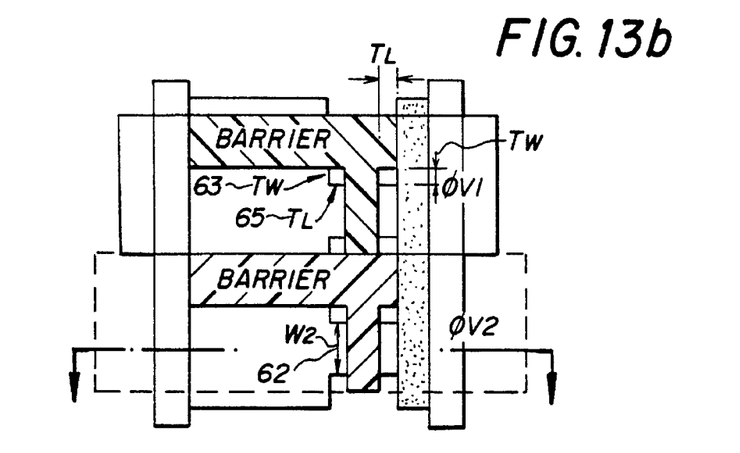
FIG. 13b is a device similar to FIG. 13a a without the self-alignment features within the antiblooming channels.

From the above relationships, it is clearly evident that the amount of antiblooming is proportional to the width of the antiblooming channel and inversely proportional to the length. Prior art devices have alignment tolerances that require spacing. This tolerance space occurs at the expense of space used, otherwise, for antiblooming channel width, for example. These tolerances can be seen in FIG. 13b, which is an illustration of a similar device to that of FIG. 13a, however the device of 13b is without the self alignment feature of the antiblooming channels taught by the present invention. The width of the antiblooming channel within the relationship indicated by Equation 1 and Equation 2 is W2 (62) on FIG. 13b. W2 (62) is narrowed by an amount equal to twice the tolerance width, indicated as $T_w$ (63). This is corrected in the present invention by creating a self aligned antiblooming channel that does not require alignment tolerances. This results in an increase in the width of the antiblooming channel and increased antiblooming protection.

Referring once again to the device of FIG. 13a there are isolation regions 58 between phases within the CCD. The isolation regions 58 are constructed to receive both the antiblooming region implants 68 (not shown) and the CCD barrier region implants 69 (not shown). The CCD barrier implants are conventionally used to create an implanted barrier two phase device. These isolation regions prevent inadvertent transfer of charge into the LOD during normal charge transfer between phases. These isolation regions are present in the same relative positions under all phases 1 and 2 of the CCD. The self aligned antiblooming regions are naturally employed to construct these isolation regions resulting in self aligned isolation regions.

Figure 14:
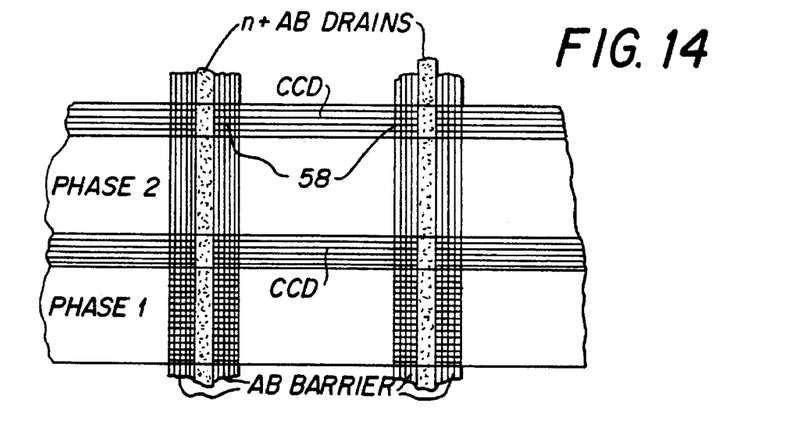
FIG. 14 is an alternate configuration of the present invention wherein blooming channels are only provided in one phase of the two-phase CCD.

Referring now to FIG. 14, which is an alternate configuration to which the present invention can be employed, wherein only one phase (phase 2 in this case) has an antiblooming channel. This configuration is discussed in U.S. Pat. No. 5,349,215. The blooming channel under phase 1 is eliminated by implanting these regions with both the antiblooming and CCD barrier region implants, thereby effectively turning these regions off (as done to form the CCD-to-LOD isolation regions as discussed above). This has effect of forcing excess charge into the second phase of the CCD in order for any antiblooming of the excess charge to take place. The construction of such a device is enhanced via self alignment as taught by the present invention.

Additional variations of the present invention could include heavy p-type channel stops adjacent to each CCD channel to allow the device to run in the accumulation mode as described in U.S. Pat. No. 5,115,458. Another variation would be to employ the present invention upon CCD devices having more than two phases.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

Parts List:

2 major structure
10 CCD
12 p-silicon substrate
14 Dielectric layer
16 Deposited silicon layer
18 masking ($Si_3N_4$) layer
20 photoresist layer
22 Antiblooming barrier region openings
23 p-type antiblooming barrier implants
25 LOCOS region of FIG. 4 and 6
30 photoresist layer
31 LOD implant opening
32 LOD
35 n-type channel
37 gate electrode
38 Dielectric layer
42 p-type antiblooming barrier implant
43 opening
45 N-channel
52 LOCOS region of FIG. 11
53 Antiblooming barrier region
55 LOD
58 isolation regions
59 L length of antiblooming channel
60 W1 width of antiblooming channel
62 W2 width of prior art antiblooming channel
63 $T_w$, the antiblooming width tolerance
65 $T_L$, the antiblooming length tolerance
68 Antiblooming region implants
69 CCD region implants

We claim:

1. A method of manufacturing an antiblooming structure for an image sensing device comprising the steps of:

providing a semiconductor substrate of a first conductivity type, having a series of layer used for masking purposes contained on a major surface of the substrate;

defining a first pattern upon the series of layers on the major surface;

etching away a portion of the masking layer which is defined by the first pattern to form at least a pair of spaced walls;

implanting a first conductivity type dopant into the substrate, through the spaced walls, to form a least elat one antiblooming barrier region of the first conductivity type in at least one area defined by the spaced walls;

forming a mask within and defined by the spaced walls;

defining a second pattern that employs the mask to form at least a portion of the second pattern, to create the second pattern that is self aligned with at least one wall of the pair of spaced walls;

etching away a second set of the series of layers in accordance with the second pattern to create an area that is self aligned with the spaced walls; and implanting within the substrate between the spaced walls a second conductivity type dopant that is opposite the first conductivity type such to form a drain region is adjacent and self aligned to the antiblooming barrier region(s) to form a lateral overflow drain region of the antiblooming structure.

2. The method of claim 1 wherein the step of forming a mask further comprises forming at least one LOCOS region on top of a deposited silicon layer masking layers not removed by the etching steps, and within the spaced walls such that the at least one LOCOS region is self aligned with the antiblooming barrier regions.

3. The method of claim 2 further comprising the steps of:

removing masking layers not removed by the etching steps that were used to define the LOCOS;

covering the major surface of the substrate with a photoresist;

patterning the photoresist leaving a portion of the LOCOS region and the drain region uncovered;

anisotropically etching the remaining masking material within the drain region; and implanting a second conductivity type dopant, that is opposite in conductivity from the first conductivity type, into an area defined by the photoresist and the drain region.

4. The method of claim 1 wherein the image sensing device is a charge coupled device (CCD) having a plurality of cells.

5. The method of claim 4 wherein the step of providing further comprises providing adjacent the CCD with the plurality of cells such that there are at least two phases within each of the cells having CCD barrier regions between the phases.

6. The method of claim 5 further comprising the step of providing at least one isolation region defined by the intersection of the antiblooming barrier regions with the CCD barrier regions and the resulting summation of implanted doping levels for each region by creating the CCD having barrier regions perpendicular to the direction of charge transfer, and with the antiblooming structure adjacent the CCD parallel the direction of charge transfer.

7. The method of claim 6 wherein the step of providing the isolation regions further comprises providing isolation regions along the antiblooming barrier regions of all but one phase of each cell of the CCD.

8. The method of claim 7 wherein the step of providing the isolation regions further comprises providing a two-phase CCD with isolation regions being created within and along the entire length of one phase of each cell of the CCD for alternating phases.

9. A method of manufacturing an antiblooming structure for image sensors comprising the steps of:

providing a semiconductor substrate of a first conductivity type, having a series of layers used for masking purposes, including a deposited silicon layer, contained on a major surface of the substrate;

defining a first pattern upon the major surface;

etching away a first portion of the series of layers defined by the first pattern to form at least a pair of spaced walls;

implanting a first conductivity type dopant into the substrate through the spaced walls to form at least one antiblooming barrier region of the first conductivity type;

forming at least one LOCOS region on the deposited silicon layer within the spaced walls such that the LOCOS region is self aligned with the barrier regions;

defining a second pattern that employs the LOCOS to form at least a portion of the second pattern, to create the second pattern that is self aligned with at least one wall of the pair of spaced walls;

etching away a second portion of the series of layers according to the second pattern to create an area that is self aligned with the spaced walls; and covering the major surface of the substrate with a photoresist material;

patterning the photoresist leaving a portion of the LOCOS region and the drain region uncovered;

removing masking layers within the spaced walls that were used to define the LOCOS region;

anisotropically etching masking material within the drain region that was not previously removed by the etching steps; and implanting a second conductivity type dopant, that is opposite in conductivity from the first conductivity type, into an area defined by the photoresist and the drain region.

10. The method of claim 9 wherein the defining step defines the antiblooming barrier region such that it comprises a plurality of spaced areas separated by the drain region.

11. A method of manufacturing an antiblooming structure for image sensors comprising the steps of:

providing a semiconductor substrate of a first conductivity type, having a series of masking layers contained on a major surface of the substrate;

defining a first pattern upon the major surface;

removing away a first portion of the series of layers defined by the first pattern to form at least a pair of spaced walls;

forming a mask within and defined by the spaced walls;

defining a second pattern that employs the mask to form at least a portion of the second pattern, to create the second pattern that is self aligned with at least one wall of the pair of spaced walls;

removing a second portion of the series of masking layers according to the second pattern to create a drain region that is self aligned with the spaced walls;

implanting a second conductivity type dopant within the drain region to form a lateral overflow drain such that the drain has at least one edge that is self aligned with the spaced walls;

removing remaining masking layers as defined by the spaced walls; and implanting a first conductivity type dopant to form an antiblooming barrier of the first conductivity type between unremoved portions of the masking layers such that the barrier region is self aligned with the outside edge of the spaced walls.

12. The method of claim 11 further comprising the step of creating isolation regions along the antiblooming barrier.

13. The method of claim 12 wherein the step of creating further comprises creating a two-phase CCD with isolation regions being created within the one phase of each cell of the CCD.

14. The method of claim 11 wherein the step of defining a first pattern further comprises defining at least one antiblooming barrier region and a drain area adjacent to the antiblooming barrier region on the major surface of the substrate.

15. The method of claim 14 wherein the removing away step further comprises removing masking layers from the antiblooming barrier region to create the spaced walls within unremoved portions of the masking layers, such that the spaced walls have an inside edge adjacent to the drain area and an outside edge.

16. The method of claim 11 wherein the step of providing further comprises providing the semiconductor substrate of a first conductivity type, having the series of masking layers, including a deposited silicon layer, contained on the major surface of the substrate.

17. The method of claim 16 wherein the step of forming a mask further comprises forming a LOCOS within each of the spaced walls within in the antiblooming barrier region such that the LOCOS is self aligned with edges of the antiblooming barrier regions that have been defined by the spaced walls.

18. The method of claim 17 wherein the step of defining the second pattern further comprises defining a photoresist layer that leaves the drain region and a portion of the LOCOS over the antiblooming barrier region exposed.

19. The method of claim 18 wherein the step of removing further comprises removing remaining masking layers on top of the drain region such that at least one edge of the drain region is self aligned to the LOCOS.

20. The method of claim 19 wherein the step of implanting a drain further comprises implanting the drain of the second conductivity type within a drain region such that the drain has at least one edge that is self aligned with the LOCOS.

21. The method of claim 20 wherein the step of removing remaining masking layers further comprises removing photoresist layers and removing the LOCOS.

22. The method of claim 21 wherein following the removing the LOCOS further comprising step of anisotropically etching depositing silicon formerly beneath the LOCOS.

* * * * *